United States Patent [19]

Matsuda

[11] Patent Number: 5,550,325
[45] Date of Patent: Aug. 27, 1996

[54] PRINTED-CIRCUIT BOARD INCLUDING CIRCUIT PATTERN HAVING LOCATION TO BE CUT IF NECESSARY

[75] Inventor: Shinji Matsuda, Kawasaki, Japan

[73] Assignee: Fujitsu Limited, Kawasaki, Japan

[21] Appl. No.: 300,861

[22] Filed: Sep. 6, 1994

[30] Foreign Application Priority Data

Sep. 27, 1993 [JP] Japan .................................. 5-239873

[51] Int. Cl.$^6$ ................................................ H05K 001/00
[52] U.S. Cl. .................... 174/250; 174/255; 174/262; 174/265
[58] Field of Search ..................... 174/250, 262, 174/263, 264, 265, 266, 255; 361/748

[56] References Cited

U.S. PATENT DOCUMENTS 4,806,706 2/1989 Machida et al. .
5,200,580 4/1993 Sienski .

Primary Examiner—Kristine L. Kincaid
Assistant Examiner—Cheryl R. Figlin
Attorney, Agent, or Firm—Armstrong, Westerman, Hattori, McLeland & Naughton

[57] ABSTRACT

A printed-circuit board includes an insulating substrate, at least one insulating layer formed on the substrate, a circuit pattern formed on the layer, and a protective coating layer formed on the insulating layer having the circuit pattern formed thereon. The circuit pattern has a location to be cut, if necessary. A material of the protective coating layer is at least partially eliminated from two zones which are disposed at sides of the location to be cut, and a material of the insulating layer may be further at least partially eliminated from those zones.

9 Claims, 3 Drawing Sheets

PRINTED-CIRCUIT BOARD INCLUDING CIRCUIT PATTERN HAVING LOCATION TO BE CUT IF NECESSARY

FIELD OF THE INVENTION

The present invention relates to a printed-circuit board, and more particularly to such a printed-circuit board including a circuit pattern which is intended to be cut at a given location thereof with a laser beam, if necessary.

DESCRIPTION OF THE RELATED ART

As one type of printed-circuit board, a printed-circuit board is well known, which comprises: a plate-like substrate made of a suitable insulating material such as a ceramic material and having a circuit pattern formed thereon; at least one dielectric layer coated on the plate-like substrate and having a circuit pattern formed thereon; and a protective coating layer with which the surface of the dielectric layer is covered.

In this printed-circuit board, the formation of the respective circuit patterns on the substrate and the dielectric layer is carried out by a well-known photolithographic process, and electrical connections between both the circuit patters are suitably established through via-holes provided in the dielectric layer, whereby a circuit arrangement is constructed in the printed-circuit board, for a plurality of electronic devices such as an IC (Integrated Circuit), LSI (Large Scale Integration) or the like to be mounted thereon.

In this type of printed-circuit board, each of the circuit patterns is intended to be cut at given locations thereof, if necessary. Namely, the printed-circuit board is previously provided with some locations to be cut, for the purpose of reconstruction and/or reparation of the circuit patterns which may be necessary in the future.

Conventionally, the cutting of the circuit pattern at the given location thereof is carried out by using a YAG laser beam, but various problems are involved during the cutting operation, as explained below:

a) The cutting of the circuit pattern with the YAG laser beam necessarily causes with a groove-like incision of the protective coating layer of the printed-circuit board, so that the protective coating layer is susceptible to peeling from the dielectric layer at that incision.

b) During the cutting operation, a small part of the materials of the protective coating and dielectric layers is vaporized due to the heat of the YAG laser beam, and another small part thereof is carbonated and radially scattered, as fine particles, from the location on which the YAG laser beam is made incident. A part of the scattered fine particles is accumulated in the ends of the groove-like incision formed in the protective coating and dielectric layers, and thus a complete non-conductivity cannot be necessarily ensured at the cut location of the circuit pattern due to the accumulation of carbonized fine particles in the incision.

c) The major part of the scattered fine particles pollute the surface of the printed-circuit board.

Although a spot diameter of the YAG laser beam may be made small or an irradiation time of the YAG laser beam may be shortened to handle the problems of the peeling of layers and the production of carbonized fine particles, these approaches are unwise because complete cutting of the circuit pattern cannot be ensured.

SUMMARY OF THE INVENTION

Therefore, an object of the present invention is to provide a printed-circuit board which is constituted such that the various problems as mentioned above can be resolved.

In accordance with an aspect of the present invention, there is provided a printed-circuit board comprising: a substrate member made of a suitable insulating material; at least one insulating layer formed on the substrate member; a circuit pattern formed on the insulating layer, the circuit pattern having a location to be cut, if necessary; and a protective coating layer formed on the insulating layer having the circuit pattern formed thereon, wherein a material of the protective coating layer is at least partially eliminated from two zones which are disposed at sides of the location to be cut. In the present invention, a material of the insulating layer may further be at least partially eliminated from the above-mentioned zones. Preferably, the material of the protective coating layer is further eliminated from the location to be cut.

In accordance with another aspect of the present invention, there is provided a printed-circuit board comprising: a substrate member made of a suitable insulating material; at least one insulating layer formed on the substrate member; and a circuit pattern formed on the insulating layer, the circuit pattern having a location to be cut, if necessary, wherein a material of the insulating layer is at least partially eliminated from two zones which are disposed at sides of the location to be cut.

BRIEF DESCRIPTION OF THE DRAWINGS

The other objects and advantages of the present invention will be better understood from the following description, with reference to the accompanying drawings, in which.

DESCRIPTION OF THE PREFERRED EMBODIMENTS

Figure 1:
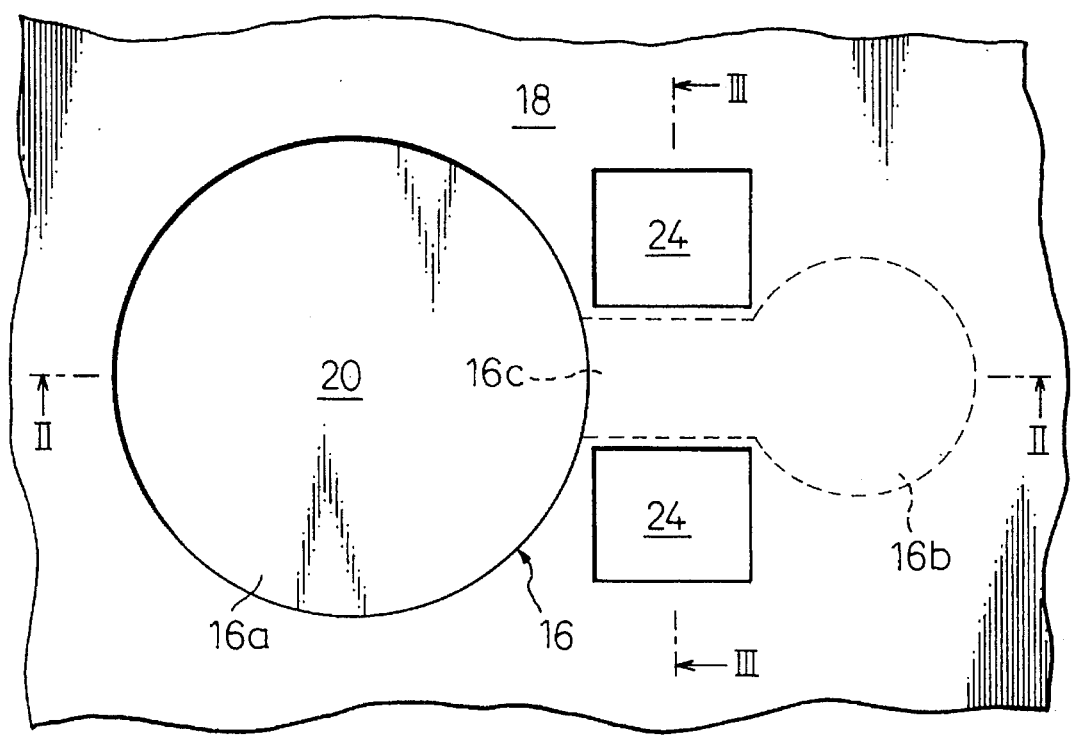
FIG. 1 is a partial plan view showing a first embodiment of a printed-circuit board according to the present invention.
Figure 2:
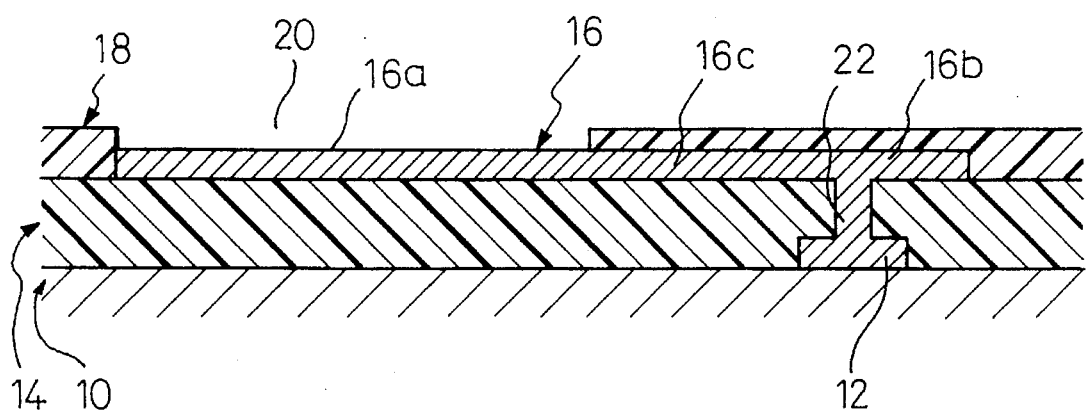
FIG. 2 is a cross-sectional view taken along a line II—II of FIG. 1.

FIGS. 1 and 2 show a part of a printed-circuit board which comprises a plate-like substrate 10 preferably made of a ceramic material and having a circuit pattern formed thereon, and a conductive segment forming a part of that circuit pattern is indicated by reference numeral 12 (FIG. 2). The printed-circuit board also comprises at least one dielectric insulating layer 14 preferably made of a polyimide resin and formed on the substrate 10 to cover the circuit pattern thereon. The insulating layer 14 has a circuit pattern formed thereon, and a conductive segment forming a part of that circuit pattern is indicated by reference numeral 16. The conductive segment 16 includes a large pad 16a to which a given lead or terminal of an electrical device is adapted to be soldered, a small pad 16b disposed beside the large pad 16, and a portion 16c integrally extended between the large and small pad 16a and 16b, and the portion 16c provides a location to be cut.

A protective coating layer 18, which is preferably made of a polyimide resin, is formed on the insulating layer 14 to cover the circuit pattern formed thereon, and a plurality of windows are defined in the protective coating layer 18 to partially expose the circuit pattern to the outside, so that leads or terminals of various electronic devices can be soldered to the exposed zones upon mounting them on the printed-circuit board. In the example shown in FIG. 1 and 2, a window 20 is defined in the protective coating layer 18 to expose the large pad 16a of the conductive segment 16 to the outside, whereby the given lead or terminal of the electrical device as mentioned above can be soldered to the large pad 16a.

Electrical connections between the respective circuit patterns formed on the substrate 10 and the insulating layer 14 are suitably established by through-holes provided in the insulating layer 14, whereby a given circuit arrangement is created in the printed-circuit board. In the example shown in FIGS. 1 and 2, the small pad 16b of the conductive segment 16 is electrically connected to the conductive segment 12 by a through hole 22 which is formed in the insulating layer 14.

Figure 3:
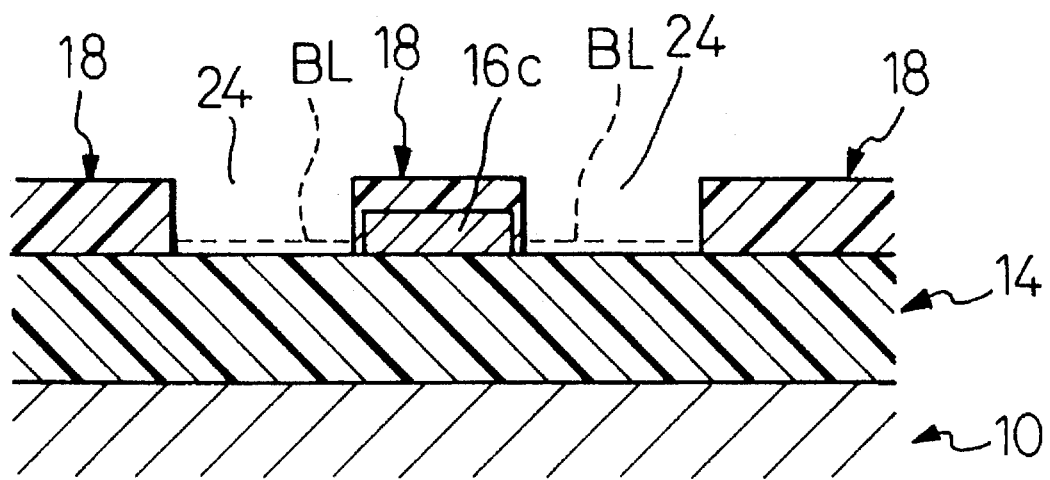
FIG. 3 is a cross-sectional view taken along a line III—III of FIG. 1.

According to the present invention, as shown in FIGS. 1 and 3, two windows 24 are formed in the protective coating layer 18, and are disposed beside the sides of the portion 16c of the conductive segment 16 formed on the insulating layer 14. When the portion 16c is cut with a YAG laser beam to break an electrical connection between the pads 16a and 16b, for the purpose of reconstruction and/or reparation of the circuit arrangement created in the printed-circuit board, the YAG laser beam is generated to be directed to one of the windows 24, and is then moved across the portion 16c toward the other window 24, so that a groove-like incision is formed in the portion 16c. The ends of the groove-like incision are opened due to the existence of the windows 24. During the cutting operation, a part of the materials of the protective coating and dielectric layers 18 and 14 is vaporized due to the heat of the YAG laser beam, and another small part thereof is carbonized and radially scattered, as fine particles, from the location on which the YAG laser beam is made incident. No part of the scattered fine particles can be accumulated in the opened ends of the groove-like incision, and thus a complete non-conductivity can be ensured at the cut location of the portion 16c of the conductive segment 16. Note that, when the YAG laser beam has a larger spot diameter than a lateral width of the portion 16c, the YAG laser may be incident on a center of the portion 16c without being moved thereacross.

A method for production of the printed-circuit board as mentioned above may be summarized as follows:

a) First, a ceramic substrate (10) is coated with a suitable metal material such as copper by, for example, a sputtering process, so that a conductive metal film is formed on the substrate (10).

b) The conductive metal film is treated by a photolithographic process such that a given circuit pattern (12) is formed on the substrate layer (10).

c) The substrate (10) with the circuit pattern (12) is spin-coated with, for example, a polyimide precursor, and the coated polyimide precursor is then polymerized so that a thin film polyimide layer (14) is formed on the substrate (10).

d) The polyimide layer (14) is treated by a photolithographic process such that fine holes for forming through-holes (22) are formed in the polyimide layer (14).

e) The polyimide layer (14) is coated with a suitable metal material such as copper by, for example, a sputtering process, so that a conductive metal film is formed on the polyimide layer (14). Note, during the sputtering process, the fine holes formed in the polyimide layer (14) are filled with the sputtered metal material so as to be formed as the through-holes (22).

f) The conductive metal film is treated by a photolithographic process such that a given circuit pattern (16) is formed on the polyimide layer (14). Note, electric connections between the circuit patterns (12, 16) are established by the through-holes (22).

g) The polyimide (14) with the circuit pattern (16) is spin-coated with, for example, a polyimide precursor, and the coated polyimide precursor is then polymerized so that a thin film polyimide layer (18) is formed as a protective coating layer (18).

h) The protective coating layer (18) is treated by a photolithographic process such that windows (20, 24) are formed in the protective coating layer (18). The formation of the windows (20, 24) may be carried out by decomposing and vaporizing a material of the protective coating layer (18) with irradiation of an excimer laser beam.

In the example as mentioned above, although the insulating layer 14 and the protective coating layer 18 are made of the polyimide resin, an individual suitable physical property can be given to each of the layers by performing the polymerization at a different temperature. Also, the protective coating layer (18) may be made of a suitable inorganic material such as silicon nitride ($Si_3N_4$) with, for example, a chemical vapor deposition (CVD) process. Further, the material of the protective coating layer 18 may not necessarily be completely eliminated from the windows 24.

In the embodiment as mentioned above, a very fine film layer of the protective coating layer material may be left on the bottom of the window 24, as shown by a broken line and indicated by reference "BL" in FIG. 3. In this modified embodiment, when a groove-like incision is formed in the portion 16c with the YAG laser beam, the ends of the groove-like incision are opened due to the existence of the windows 24, and thus no part of the scattered fine particles can be accumulated in the opened ends of the groove-like incision.

Figure 4:
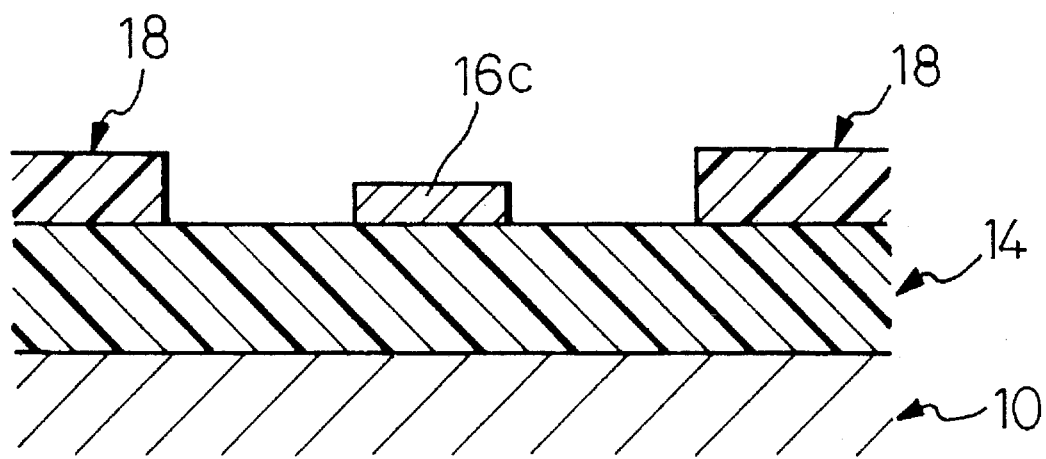
FIG. 4 is a cross-sectional view similar to FIG. 3, showing a modification of the embodiment shown in FIGS. 1 to 3.

FIG. 4 shows a modification of the embodiment shown in FIGS. 1 to 3. In this modified embodiment, the material of the protective coating layer 18 is further eliminated from the portion 16c of the conductive segment 16. As mentioned in the foregoing, when the incision is formed in the protective layer 18, it is susceptible to peeling from the insulating layer 14 at that incision. However, according to the modified embodiment of FIG. 4, the peeling problem can be resolved due to the elimination of the protective layer material from the portion 16c. The elimination of the protective layer material from the portion 16c can be simultaneously carried out by the photolithographic process in which the windows (20, 22) are formed in the protective coating layer 18. Of course, the elimination is also possible by the irradiation of the excimer laser beam.

Figure 5:
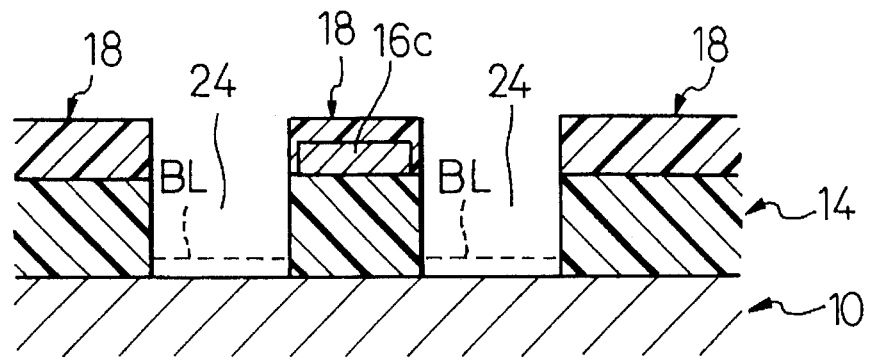
FIG. 5 is a cross-sectional view similar to FIG. 3, showing another modification of the embodiment shown in FIGS. 1 to 3.

FIG. 5 shows another modification of the embodiment shown in FIGS. 1 to 3. In this modified embodiment, a material of the insulating layer 14 is also eliminated from the windows 24. As mentioned above, during the cutting operation, a small part of the materials of the protective coating and insulating layers 18 and 14 is carbonized and radially scattered, as fine particles, from the location on which the YAG laser beam is made incident, and the major part of the scattered fine particles pollutes the surface of the printed-circuit board. However, according to the modified embodiment of FIG. 5, the amount of the fine particles produced during the cutting operation can be decreased due to the elimination of the insulating layer material from the windows 24, and thus the pollution problem can be considerably reduced. The elimination of the insulating layer material from the windows 24 can be simultaneously carried out by the photolithographic process in which the fine holes for forming the through-holes (22) are formed in the insulating layer 14. Of course, the elimination of the insulating layer material is also possible by the irradiation of the excimer laser beam. Note, in this modified embodiment, a very fine film layer of the insulating layer material may be left on the bottom of the window 24, as shown by a broken line and indicated by reference "BL".

Figure 6:
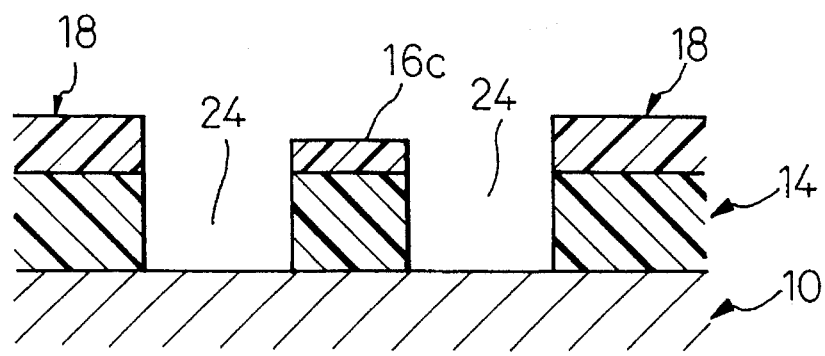
FIG. 6 is a cross-sectional view similar to FIG. 5, showing a further modification of the modified embodiment shown in FIG. 5.

FIG. 6 shows a modification of the embodiment shown in FIG. 5, which is similar to the embodiment shown in FIG. 4. In this modified embodiment, the material of the protective coating layer 18 is further eliminated from the portion 16c of the conductive segment 16.

Figure 7:
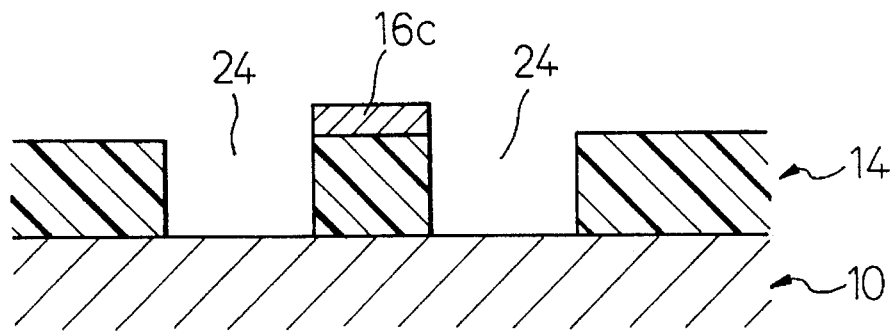
FIG. 7 is a cross-sectional view corresponding to FIG. 3, and showing a second embodiment of the printed-circuit board according to the present invention.

FIG. 7 shows a second embodiment of the printed-circuit board according to the present invention, in which no protective coating layer is formed on the insulating layer 14 having the circuit pattern (16) formed thereon. In this embodiment, the windows 24 are formed in the insulating layer 14 by eliminating the material thereof. Of course, in this embodiment, when a groove-like incision is formed in the portion 16c with the YAG laser beam, the ends of the incision are opened due to the existence of the windows 24. Accordingly, similar to the embodiments as mentioned above, during the cutting operation, the accumulation of the scattered fine particles in the opened ends of the groove-like incision cannot take place. Also, the pollution problem as mentioned above can be also reduced. In this embodiment, a very fine film layer of the insulating layer material may be left on the bottom of the windows 24, similar to the embodiment of FIG. 5.

In the embodiments, as shown in FIGS. 5, 6, and 7, in which the material of the insulating layer 14 is eliminated from the windows 24, not only can a spot diameter of the YAG laser beam can be made larger, but also a time of irradiation of the YAG laser beam can be made longer, because an amount of the fine particles produced during the cutting operation can be considerably reduced due to the elimination of the insulating layer material from the windows 24. Accordingly, the cutting of the portion 16c can be quickly and effectively carried out.

In the embodiments as mentioned above, although the location to be cut is provided by the portion 16c of the conductive segment 16, it should be understood that any location of the circuit pattern may be selected as the location to cut, if necessary.

Finally, it will be understood by those skilled in the art that the foregoing description is of a preferred embodiment of the disclosed printed-circuit board, and that various changes and modifications may be made to the present invention without departing from the spirit and scope thereof.

I claim:

1. A printed-circuit board, comprising:

a substrate member made of a suitable insulating material;

at least one insulating layer formed on said substrate member;

a circuit pattern formed on said insulating layer, said circuit pattern having a location capable of being cut; and a protective coating layer formed on said insulating layer having said circuit pattern formed thereon, wherein said protective coating layer has a portion with a first thickness, and wherein said protective coating further has at least two zones different from said portion with said first thickness, said two zones having second thicknesses which are substantially thinner than said first thickness and being disposed at sides of the location to be cut.

2. A printed-circuit board as set forth in claim 1, wherein portions of said insulating layer are exposed through said protective coating layer at the location to be cut.

3. A printed-circuit board, comprising:

a substrate member made of a suitable insulating material;

at least one insulating layer formed on said substrate member;

a circuit pattern formed on said insulating layer, said circuit pattern having a location capable of being cut; and a protective coating layer formed on said insulating layer having said circuit pattern formed thereon, wherein portions of said insulating layer are exposed through zones which are disposed at sides of the location to be cut.

4. A printed-circuit board as set forth in claim 3, wherein other portions of said insulating layer are exposed through said protective coating layer at the location to be cut.

5. A printed-circuit board, comprising:

a substrate member made of a suitable insulating material;

at least one insulating layer formed on said substrate member;

a circuit pattern formed on said insulating layer, said circuit pattern having a location capable of being cut; and a protective coating layer formed on said insulating layer having said circuit pattern formed thereon, wherein portions of said insulating layer are exposed through two zones of said protective coating layer disposed at sides of the location to be cut and have reduced thicknesses.

6. A printed-circuit board as set forth in claim 5, wherein other portions of said insulating layer are exposed through said protective coating layer at the location to be cut.

7. A printed-circuit board, comprising:

a substrate member made of a suitable insulating material;

at least one insulating layer formed on said substrate member;

a circuit pattern formed on said insulating layer, said circuit pattern having a location capable of being cut; and a protective coating layer formed on said insulating layer having said circuit pattern formed thereon, wherein portions of said substrate member at sides of the location to be cut are exposed through portions of said insulating layer at two zones of said protective coating layer and through said two zones.

8. A printed-circuit board as set forth in claim 7, wherein other portions of said insulating layer are exposed through said protective coating layer at the location to be cut.

9. A printed-circuit board, comprising:

a substrate member made of a suitable insulating material;

at least one insulating layer formed on said substrate member; and a circuit pattern formed on said insulating layer, said circuit pattern having a location capable of being cut, wherein portions of said insulating layer at two zones, which are disposed beside lateral sides of the location to be cut, have reduced thicknesses.

* * * * *